(12) United States Patent
Hanaoka

(10) Patent No.: US 6,924,558 B2
(45) Date of Patent: Aug. 2, 2005

(54) SEMICONDUCTOR DEVICE AND METHOD OF FABRICATING THE SAME, CIRCUIT BOARD, AND ELECTRONIC INSTRUMENT

(75) Inventor: Terunao Hanaoka, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/678,215

(22) Filed: Oct. 6, 2003

(65) Prior Publication Data
US 2004/0124529 A1 Jul. 1, 2004

(30) Foreign Application Priority Data

Oct. 11, 2002 (JP) .................................. 2002-298323
Sep. 10, 2003 (JP) .................................. 2003-318080

(51) Int. Cl.⁷ .................. H01L 23/48; H01L 23/52; H01L 29/40
(52) U.S. Cl. .................. 257/786; 257/773; 257/737; 257/738; 257/780; 257/787
(58) Field of Search .................... 257/786, 773, 257/737, 738, 780, 787, 669

(56) References Cited

U.S. PATENT DOCUMENTS 5,220,199 A * 6/1993 Owada et al. .............. 257/773

FOREIGN PATENT DOCUMENTS

JP      A 11-297873      10/1999

* cited by examiner

*Primary Examiner*—Nitin Parekh
(74) *Attorney, Agent, or Firm*—Oliff & Berridge PLC (57) ABSTRACT

A semiconductor device has: a semiconductor substrate having an integrated circuit and an electrode that is connected electrically to the integrated circuit; a resin layer formed on a surface of the semiconductor substrate on which the electrode is formed, but avoiding the electrode; and a wiring layer that is connected electrically to the electrode and has a land which is located on the resin layer. A penetrating hole that exposes the resin layer is formed in the land.

28 Claims, 9 Drawing Sheets

FIG. 19

SEMICONDUCTOR DEVICE AND METHOD OF FABRICATING THE SAME, CIRCUIT BOARD, AND ELECTRONIC INSTRUMENT

BACKGROUND OF THE INVENTION

The present invention relates to a semiconductor device, a method of fabrication of the semiconductor device, a circuit board, together with an electronic instrument.

When a semiconductor device has been mounted on a substrate, it is important to relieve the stresses applied to the electrical connective portions of both components. These stresses are caused by the difference in the coefficients of thermal expansion of the semiconductor chip and the substrate. Since this is not possible to relieve such stresses sufficiently in the prior art, this leads to destruction of the external terminals (solder balls) of the semiconductor device and breakage of the wiring. In particular, this is expected to improve the reliability of wafer-level chip scale packaging (CSP), used to create packages in wafer units.

BRIEF SUMMARY OF THE INVENTION

According to a first aspect of the present invention, there is provided a semiconductor device comprising:

a semiconductor substrate having an integrated circuit and an electrode that is connected electrically to the integrated circuit;

a resin layer formed on a surface of the semiconductor substrate on which the electrode is formed, avoiding the electrode; and a wiring layer which is electrically connected to the electrode and has a land formed on the resin layer, wherein a penetrating hole that exposes the resin layer is formed in the land.

According to a second aspect of the present invention, there is provided a circuit board on which is mounted the above-described semiconductor device.

According to a third aspect of the present invention, there is provided an electronic instrument having the above-described semiconductor device.

According to a fourth aspect of the present invention, there is provided a method of fabricating a semiconductor device, the method comprising:

forming a resin layer on a surface of a semiconductor substrate on which is formed an electrode that is connected electrically to an integrated circuit of the semiconductor substrate, avoiding the electrode; and forming a wiring layer which is electrically connected to the electrode and has a land formed on the resin layer, wherein a penetrating hole that exposes the resin layer is formed in the land.

DETAILED DESCRIPTION OF THE EMBODIMENT

Following embodiments improve the reliability of a semiconductor device by relieving stresses created in the semiconductor device.

(1) According to one embodiment of the present invention, there is provided a semiconductor device comprising:

a semiconductor substrate having an integrated circuit and an electrode that is connected electrically to the integrated circuit;

a resin layer formed on a surface of the semiconductor substrate on which the electrode is formed, avoiding the electrode; and a wiring layer which is electrically connected to the electrode and has a land formed on the resin layer, wherein a penetrating hole that exposes the resin layer is formed in the land.

This embodiment enables the formation of a penetrating hole that exposes the resin layer, in the land. Since the land can deform readily, this makes it possible to relieve the stresses generated in the semiconductor device. It is therefore possible to prevent faults such as breaking of the wiring layer or destruction of external terminals, enabling an improvement in the reliability of the semiconductor device.

(2) In this semiconductor device, the shape of the land in plan view may be substantially circular.

(3) In this semiconductor device, the penetrating hole may be an elongated hole.

(4) In this semiconductor device, the penetrating hole may be an elongated hole extending along the outer edge portion of the land.

This makes it possible to form a penetrating hole that avoids the central portion of the land.

(5) In this semiconductor device, a plurality of the penetrating holes may be formed in the land.

This makes it even easier for the land to deform.

(6) In this semiconductor device, the penetrating holes may be arranged along the outer edge portion of the land.

Since this makes it easy for the central portion of the land to move in response to stresses, it enables effective relief of stresses.

(7) In this semiconductor device, the penetrating holes may be disposed with substantially equal distances between adjacent holes.

This facilitates deformation of the land in response to stresses applied in all directions in the plane of the land.

(8) In this semiconductor device, the land may be formed on an upper surface of the resin layer.

(9) In this semiconductor device, a plurality of the resin layers may be formed at different positions in plan view on the semiconductor substrate, and the land may be formed integrally with an upper surface and a side surface of one of the resin layers.

(10) In this semiconductor device, the penetrating hole may be formed in a portion of the land covering the side surface of the resin layer.

(11) In this semiconductor device, the side surface of the resin layer may be tapered.

This makes it easy to form a penetrating hole in a portion of the land covering the side surface of the resin layer.

(12) In this semiconductor device, the resin layer may have substantially a shape of conical frustum.

(13) This semiconductor device may further comprise:

a resist layer which is formed on a surface of the semiconductor substrate on which the electrode is formed, and has an aperture that causes at least part of the land to be exposed.

(14) In this semiconductor device, the shape of the aperture of the resist layer in plan view may be substantially circular.

(15) In this semiconductor device, the resist layer may fill at least part of the penetrating hole.

(16) In this semiconductor device, the resist layer may be formed to fill the penetrating hole, and part of an edge of the penetrating hole may be substantially in contact with an edge of the aperture of the resist layer.

(17) This semiconductor device may further comprise an external terminal provided on the land.

(18) This semiconductor device may further comprise a second resin layer that avoids an upper portion of the external terminal but covers at least a lower portion of the external terminal.

(19) In this semiconductor device, the semiconductor substrate may be a semiconductor chip.

(20) In this semiconductor device, the semiconductor substrate may be a semiconductor wafer.

(21) According to another embodiment of the present invention, there is provided a circuit board on which is mounted the above-described semiconductor device.

(22) According to further embodiment of the present invention, there is provided an electronic instrument comprising the above-described semiconductor device.

(23) According to still another embodiment of the present invention, there is provided a method of fabricating a semiconductor device, the method comprising:

forming a resin layer on a surface of a semiconductor substrate on which is formed an electrode that is connected electrically to an integrated circuit of the semiconductor substrate, avoiding the electrode; and forming a wiring layer which is electrically connected to the electrode and has a land formed on the resin layer, wherein a penetrating hole that exposes the resin layer is formed in the land.

In this embodiment, a penetrating hole that exposes the resin layer is formed in the land. Since this makes it easy for the land to deform, it is possible to relieve stresses generated in the semiconductor device. It is therefore possible to prevent faults such as breakage of the wiring layer or destruction of the external terminals, thus enabling an improvement in the reliability of the semiconductor device.

(24) In this method of fabricating a semiconductor device, the penetrating hole may be formed simultaneously with the wiring layer.

This makes it possible to fabricate the semiconductor device with fewer steps.

(25) In this method of fabricating a semiconductor device, a plurality of the penetrating holes may be formed in the land.

This makes it even easier for the land to deform.

(26) This method of fabricating a semiconductor device may further comprise:

forming a resist layer on a surface of the semiconductor substrate on which the electrode is formed, the resist layer having an aperture that causes at least part of the land to be exposed.

(27) This method of fabricating a semiconductor device may further comprise forming an external terminal on the land.

(28) This method of fabricating a semiconductor device may comprise:

forming a plurality of the resin layers at different positions in plan view on the semiconductor substrate;

providing a material of the wiring layer to cover at least the resin layer;

patterning a plated layer as a mask on the material of the wiring layer; and forming the wiring layer and the penetrating hole by etching the material of the wiring layer and the plated layer in such a manner that portions of the material of the wiring layer that are covered by the plated layer remain.

Embodiments of the present invention are described below with reference to the accompanying figures. It should be noted, however, that the present invention is not limited to the embodiments below.

First Embodiment

Figure 1:
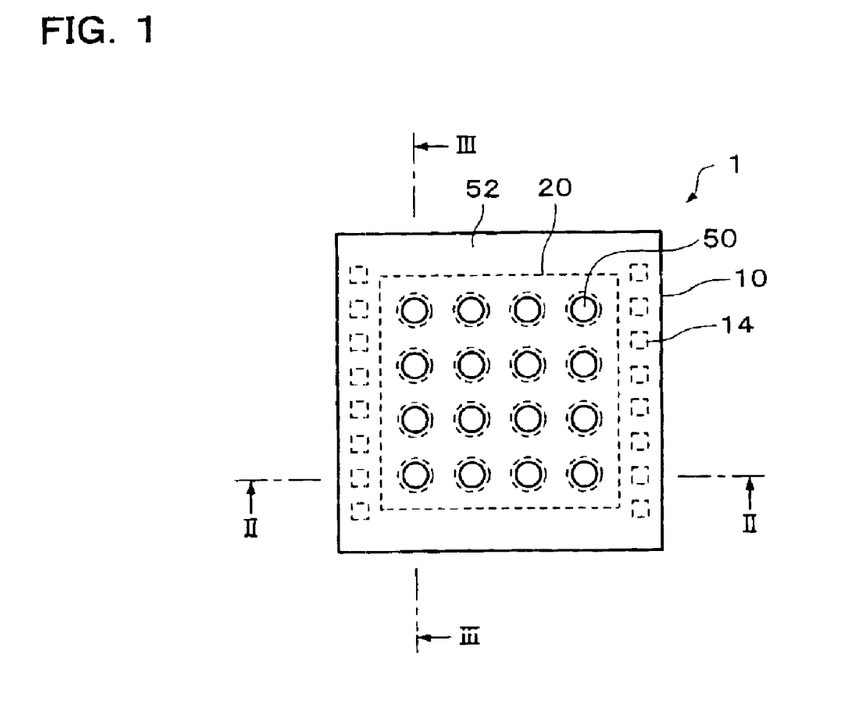
FIG. 1 is a diagram showing a semiconductor device in accordance with a first embodiment of the present invention.
Figure 2:
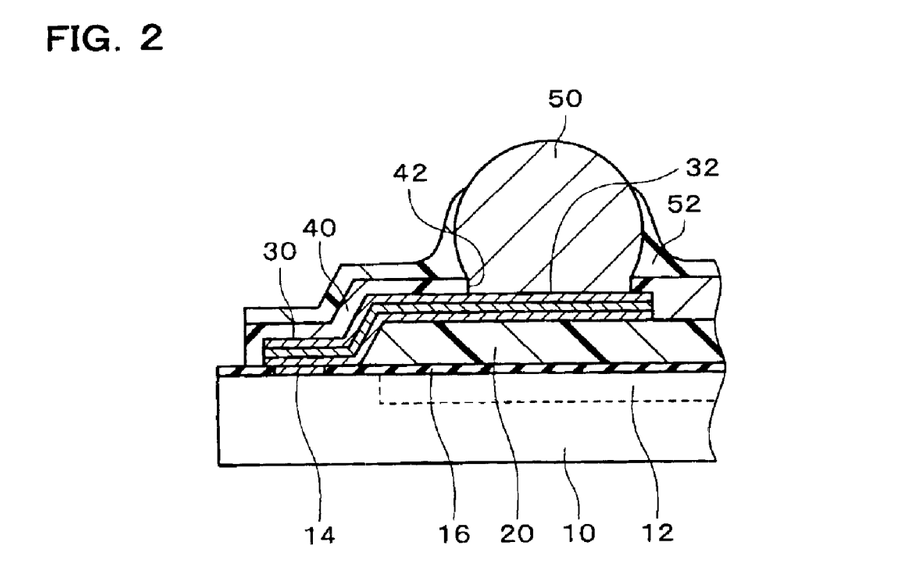
FIG. 2 is a partial enlarged sectional view of the semiconductor device taken along the line II—II of FIG. 1.
Figure 3:
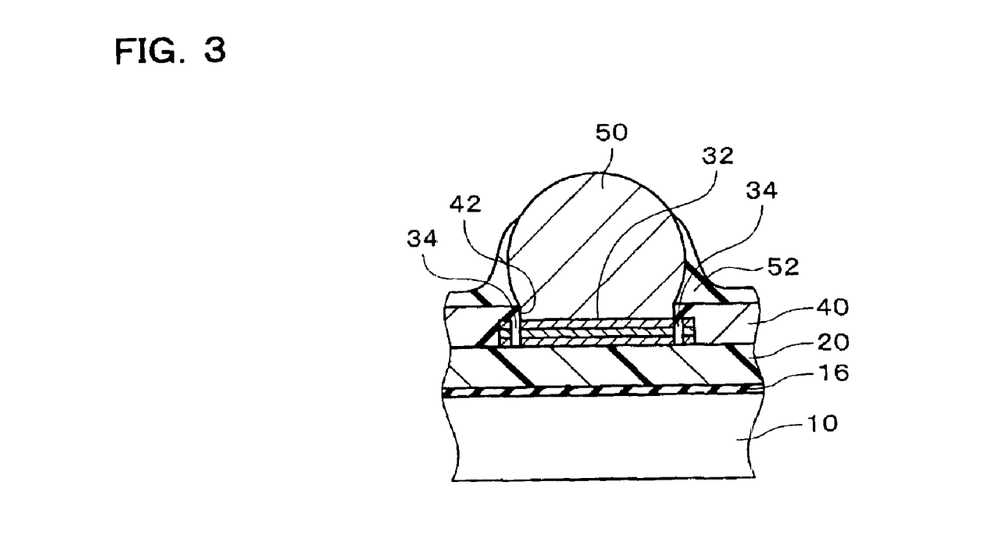
FIG. 3 is a partial enlarged sectional view of the semiconductor device taken along the line III—III of FIG. 1.
Figure 4:
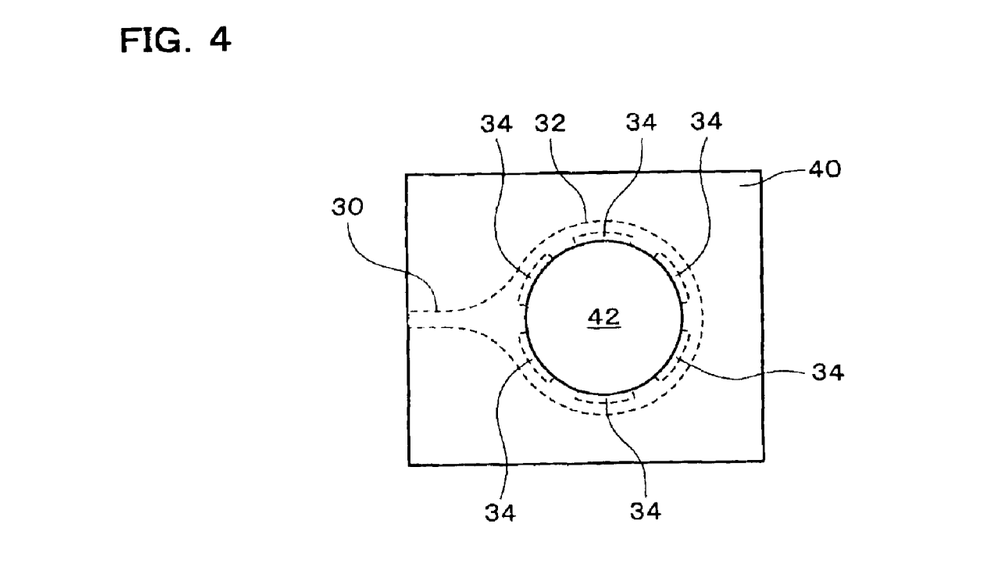
FIG. 4 is a diagram showing the semiconductor device in accordance with the first embodiment of the present invention.

A semiconductor device in accordance with a first embodiment of the present invention is shown in FIGS. 1 to 4. FIG. 1 is a plan view of the semiconductor device, FIG. 2 is a partial enlarged section taken along the line II—II of FIG. 1, and FIG. 3 is a partial enlarged section taken along the line III—III of FIG. 1. FIG. 4 is illustrative of the relationship between a land and a resist layer, with parts of the semiconductor device (such as the wiring layer and external terminals) omitted. Note that variant examples of this embodiment are shown in FIGS. 5 to 8. A semiconductor device 1 includes a semiconductor substrate 10, a resin layer 20, and a wiring layer 30.

The semiconductor substrate 10 would usually be a silicon substrate, but the material thereof is not limited thereto. As shown in FIG. 1, the semiconductor substrate 10 could also be a semiconductor chip. The shape of the semiconductor chip would usually be a rectangular solid, but it could also be a cube or a sphere.

As a variant example, the semiconductor substrate 10 could be a semiconductor wafer. A semiconductor wafer is a collection of areas that become a plurality of semiconductor chips (see FIG. 9).

As shown in FIG. 2 one or more integrated circuits 12 are formed in the semiconductor substrate 10. Each integrated circuit 12 could be formed on one surface side of the semiconductor substrate 10. If there are semiconductor chips in the semiconductor substrate 10, one integrated circuit 12 could be formed thereon. A plurality of electrodes 14 are formed for each integrated circuit 12. One of the plurality of electrodes 14 is connected electrically to the integrated circuit 12. The plurality of electrodes 14 could be arranged along two parallel sides of the semiconductor chip, as shown in FIG. 1, or they could be arranged at end portions along four sides, or arranged in a central portion thereof. A protective film (such as a passivation film) 16 is formed on a surface of the semiconductor substrate 10 (the surface on which the electrodes 14 are formed), avoiding the electrodes 14 themselves. The protective film 16 is an electrically insulating film. This protective film 16 is often formed of a non-organic material (such as SiN, SiO$_2$, or MgO), but it could also be formed of an organic material (such as a polyimide resin).

The resin layer 20 is formed above the semiconductor substrate 10 (such as over the protective film 16). The resin layer 20 is formed to avoid the electrodes 14. In the example shown in FIG. 1, the resin layer 20 is formed in a central portion, avoiding the edge portions of the semiconductor chip. The resin layer 20 could also be formed in regions that include a plurality of external terminals 50 that are formed at positions that differ in the plane. The resin layer 20 could be a single layer or a plurality of layers.

The resin layer 20 could also have a stress relieving function. The resin layer 20 can be formed of one or more layers of a resin such as a polyimide resin, a silicone denatured polyimide resin, an epoxy resin, a silicone denatured epoxy resin, benzocyclobutene (BCB), or polybenzoxazole (PBO). The resin layer 20 is formed at least between the semiconductor substrate 10 and the external terminals 50.

The wiring layer 30 is formed in a surface in which the electrodes 14 of the semiconductor substrate 10 are formed. The wiring layer 30 is connected electrically to one of the electrodes 14 and extends from the electrodes 14 above the resin layer 20. In other words, part of the wiring layer 30 (such as a land) is formed above the resin layer 20. The wiring layer 30 could be formed of one or a plurality of layers of any of: copper (Cu), chrome (Cr), titanium (Ti), nickel (Ni), titanium tungsten (TiW), gold (Au), aluminum (Al), nickel vanadium (NiV), and tungsten (W), by way of example. If the plurality of electrodes 14 is formed at edge portions of the semiconductor chip, the wiring layer 30 extends from the edge portions of the semiconductor chip to the central portion thereof.

The wiring layer 30 has a land 32. A plurality of the lands 32 are formed in the semiconductor chip. Each land 32 is part of the wiring layer 30, formed from at least one layer (a plurality of layers in the example shown in FIG. 2). The wiring layer 30 includes the land 32 and a line which connects electrically the land 32 to one of the electrodes 14. The land 32 and the line include electrically conductive layers. As shown in FIG. 4, each land 32 is wider than the lines of the wiring layer 30. The width of the land 32 is widest in the direction crossing the direction of entry of the line into the wiring layer 30. The shape of the land 32 in plan view could be circular. Alternatively, the shape of the land 32 in plan view could be elliptical or rectangular. The lands 32 are formed on an upper surface of the resin layer 20. At least part of the line is also formed on the upper surface of the resin layer 20. A plurality of the lands 32 could be formed on the upper surface of the resin layer 20.

As shown in FIG. 3, a penetrating hole 34 is formed in the land 32, exposing the resin layer 20. This ensures that the land 43 can deform readily in response to stresses, in comparison with a configuration in which there is no penetrating hole 34. In other words, it is possible to prevent breaking of the wiring layer 30 because stresses are relieved by the deformation of the land 32. If the land 32 is formed of a plurality of layers, as shown in FIG. 3, the penetrating hole 34 penetrates all of those layers. The penetrating hole 34 could be formed at an end portion of the land 32 or it could be formed at a central portion thereof. As shown in FIG. 4, a plurality of the penetrating holes 34 could be formed in one land 32. This makes it even easier for the land 32 to deform.

As shown in FIG. 4, the penetrating holes 34 could be elongated. In such a case, they could be elongated in the direction along the outer edge portion of the land 32. Since this enables the formation of the penetrating hole 34 while avoiding the central portion of the land 32, even if the elongated holes have been formed therein, it makes it possible to reserve a broad area for the provision of the external terminals 50. The corners of the inner sides of the elongated holes could be formed as angular portions.

A plurality of the penetrating holes 34 could be arranged along the outer edge portion of the land 32. In other words, a plurality of the penetrating holes 34 could be arranged along the outer periphery of the land 32, at an edge portion of the land 32. If the land 32 is circular, the plurality of penetrating holes 34 could be arranged on an imaginary circumference that is slightly smaller than the outline of the land 32. Surrounding the central portion of the land 32 with a plurality of the penetrating holes 34 makes it possible for the central portion of the land 32 to move in response to stresses, thus enabling effective relief of those stresses.

The plurality of penetrating holes 34 could be disposed with the distances between adjacent holes being substantially equal. This makes it easy for the land 32 to deform with respect to stresses applied in all directions in the plane of the land. The plurality of penetrating holes 34 could be disposed at symmetrical positions in the land 32. More specifically, the plurality of penetrating holes 34 could be disposed at positions that are point-symmetrical with respect to the center point (not shown in the figure) of the land 32, or they could be disposed at positions that are line-symmetrical with respect to the center line (not shown in the figure) of the land 32.

Figure 7:
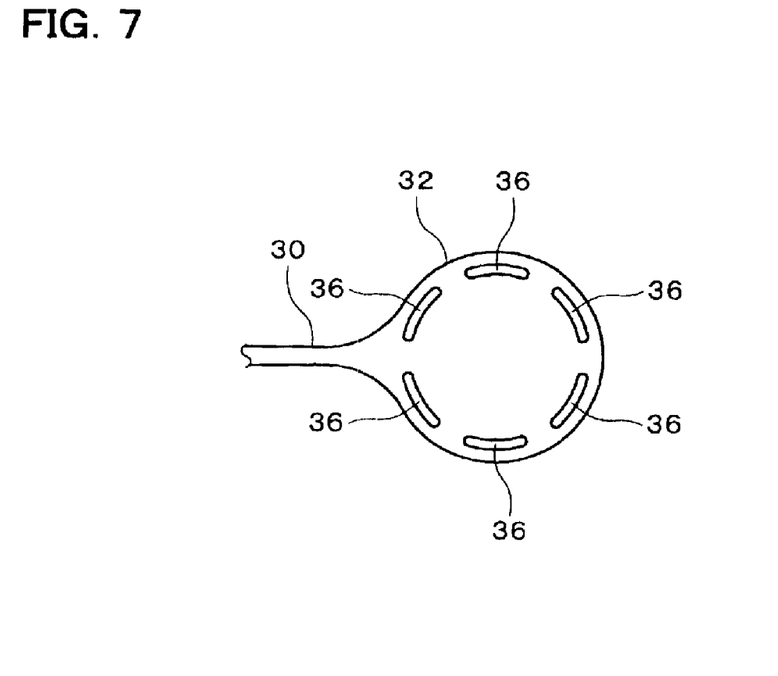
FIG. 7 is a diagram showing a semiconductor device in accordance with a further variant example of the first embodiment of the present invention.

As shown in a variant example in FIG. 7, the corners of inner sides of penetrating holes 36 that are elongated holes could be rounded. Removing the angular portions on the land makes it possible to distribute any stress concentrations applied to the land 32.

Figure 8:
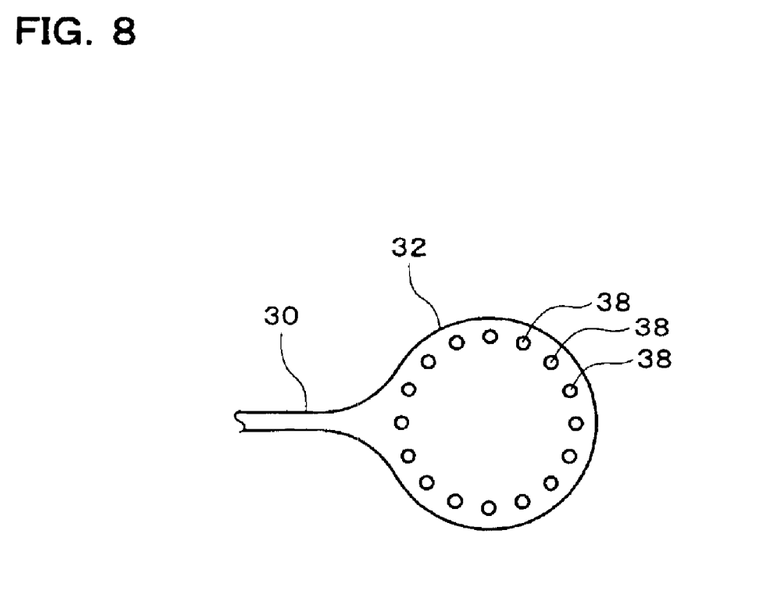
FIG. 8 is a diagram showing a semiconductor device in accordance with a still further variant example of the first embodiment of the present invention.

As shown in another variant example in FIG. 8, penetrating holes 38 could be round holes. A plurality of these round holes could be arranged along the outer edge portion of the land 32. If the distances between adjacent round holes are substantially equal, the land 32 can deform readily in response to stresses applied in all directions in the plane of the land. Separately from the example shown in FIG. 8, a plurality of penetrating holes (round holes) 38 could be formed over the entire surface of the land 32. In such a case too, the land 32 can deform easily in response to stresses.

The semiconductor device 1 further includes a resist layer (of, for example, solder resist) 40. The resist layer 40 is formed on the surface of the semiconductor substrate 10 on which the electrodes 14 are formed, to cover part of the wiring layer 30. The resist layer 40 has an aperture portion 42 that causes at least part of the land 32 to be exposed. As shown in FIG. 4, the resist layer 40 could also cover the outer peripheral edge portion of the land 32. Alternatively, the resist layer 40 could cover only the lines of the wiring layer 30, avoiding the land 32.

The shape in plan view of the aperture portion 42 of the resist layer 40 could be circular, elliptical, or rectangular. The shape in plan view of the aperture portion 42 could be similar to that of the shape in plan view of the land 32, except slightly smaller. If the resist layer 40 covers part of the land 32, the resist layer 40 could fill part of the penetrating hole 34.

As shown in FIG. 4, the resist layer 40 could fill the penetrating holes 34. Since this brings the resist layer 40 into contact with the resin layer 20 within the penetrating holes 34, it increases the adhesion therebetween. If the aperture portion 42 is circular, the contact surface between the land 32 and the external terminal 50 can also be made circular, making it possible to distribute any stress concentration on the external terminal 50. Part of an edge of the penetrating holes 34 could be substantially in contact with an edge of the aperture portion 42 of the resist layer 40. Since this ensures that part of an edge of the penetrating holes 34 are simply in contact with an edge of the aperture portion 42 and the penetrating holes 34 are not filled completely by the resist layer 40, deformation of the land 32 is not affected by the resist layer 40.

As shown in FIG. 4, a central portion of the land 32 (a region surrounded by the plurality of penetrating holes in FIG. 4) is connected at a plurality of locations to the edge portions of the land 32. This therefore ensures that stresses are concentrated in the connective portions between the central portion and the edge portions of the land 32, enabling the maintenance of connections in other locations if a break should occur in one place.

Figure 5:
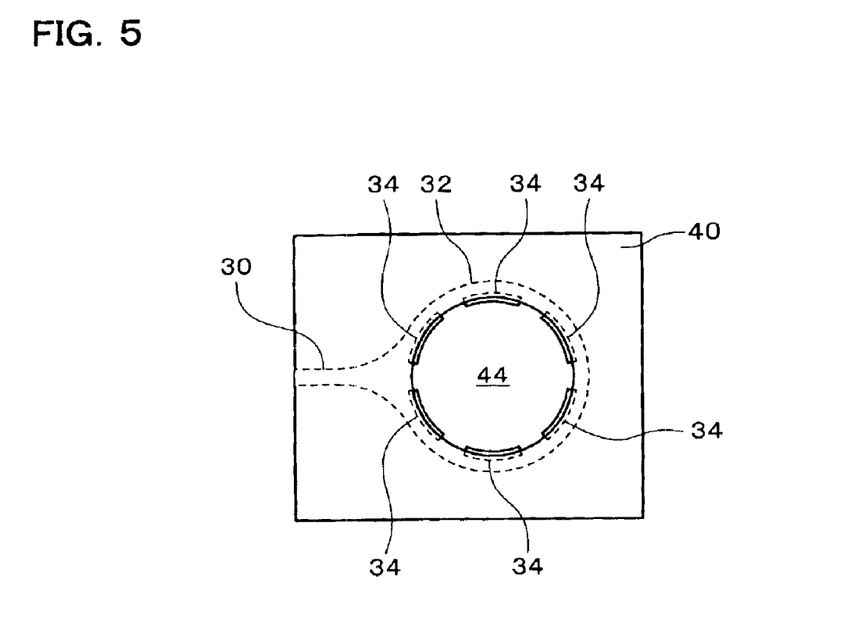
FIG. 5 is a diagram showing a semiconductor device in accordance with a variant example of the first embodiment of the present invention.

As shown in a variant example in FIG. 5, the resist layer 40 could fill part of the penetrating holes 34. In the example shown in FIG. 5, each penetrating hole 34 is partially filled. For example, the configuration could be that each penetrating hole 34 substantially half-filled by the resist layer 40, with the remaining half being exposed from an aperture portion 44. Separately from the example shown in FIG. 5, the resist layer 40 could be formed to fill at least one of the plurality of penetrating holes 34 (but not all of them).

Figure 6:
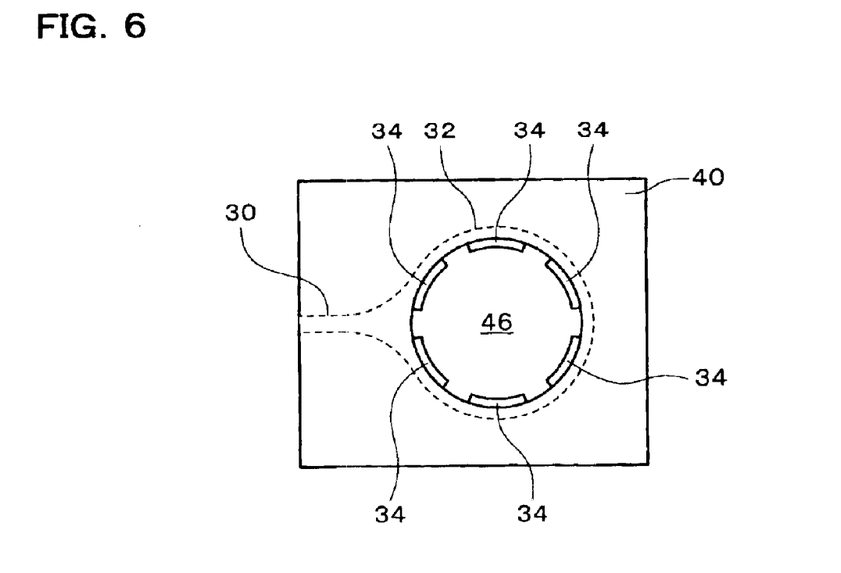
FIG. 6 is a diagram showing a semiconductor device in accordance with another variant example of the first embodiment of the present invention.

Alternately, the resist layer 40 may not fill the penetrating holes 34 at all, as shown in a variant example in FIG. 6. In other words, the plurality of penetrating holes 34 could be exposed from an aperture portion 46 of the resist layer 40. In such a case, the penetrating holes 34 could be substantially in contact with the inner periphery of the aperture portion 46 of the resist layer 40.

The semiconductor device 1 further includes the external terminals 50. The external terminals 50 are connected electrically to the wiring layer 30. Each external terminal 50 could be formed on the land 32. The external terminals 50 are of a metal that is electrically conductive (such as an alloy) and are designed to melt to provide electrical connections (such as solder). The external terminals 50 could be formed of either soft solder or hard solder. The external terminals 50 could be of a spherical shape, and they could be solder balls, by way of example.

The semiconductor device 1 further includes a second resin layer 52 that covers at least the lower end portions (root portions) of the external terminals 50, avoiding the upper end portions thereof. The second resin layer 52 could also cover a central portion in the heightwise direction of each external terminal 50. The second resin layer 52 also covers the periphery of each external terminal 50. An upper edge portion of each external terminal 50 is exposed from the second resin layer 52. The second resin layer 52 has an aperture, by way of example, and the upper end portion of each external terminal 50 is exposed from the second resin layer 52 through that aperture. The second resin layer 52 makes it possible to reinforce the connective state of the external terminals 50 with respect to the wiring layer 30. This makes it possible to disperse stress concentrations. Note that the second resin layer 52 could be formed of the same material as the resin layer 20 or of a different material.

In this embodiment, each penetrating hole 34 that exposes the resin layer 20 is formed in the land 32. Since this makes it easy for the land 32 to deform, it is possible to relieve stresses generated in the semiconductor device. It is therefore possible to prevent faults such as breaks in the wiring layer 30 or destruction of the external terminals 50, improving the reliability of the semiconductor device. Since stresses are relieved by the configuration of the land 32, a material with a low coefficient of elasticity can be used as the resin layer 20, increasing the degree of freedom of selection of the component materials.

A method of fabricating a semiconductor device in accordance with the present invention includes the steps of forming the resin layer 20 on the surface of the semiconductor substrate 10 on which the electrodes 14 are formed, avoiding the electrodes 14, and forming the wiring layer 30 in electrical contact with the electrodes 14 and having the lands 32 above the resin layer 20. The penetrating holes 34 that expose the lands 32 are then formed. The plurality of penetrating holes 34 can be formed in each land 32.

The penetrating holes 34 could be formed after the formation of the wiring layer 30. In such a case, a photographic technique or the like could be applied in which a resist (not shown in the figure) that is patterned to form a mask and a portion exposed from the resist is etched to form each penetrating hole 34. The penetrating holes 34 could also be formed simultaneously with the wiring layer 30. In such a case, the above-mentioned photographic technique could be applied for patterning the wiring layer 30 and simultaneously forming the penetrating holes 34. Alternatively, an electrically conductive material could be laid down by a plating method. If these can be formed simultaneously, it is possible to form the penetrating holes 34 simply with fewer fabrication steps. Note that the formation of the penetrating holes 34 could also be done by applying other known techniques (such as laser beams, ink jets, or printing).

Subsequently, a resist layer (of a material such as solder resist) 40 is then applied and a predetermined portion thereof (a portion comprising at least part of the land) is exposed by a photographic technique or by a laser. The external terminals 50 are then formed by printing with a material such as solder then applying a reflow process. The second resin layer 52 could then be provided over the entire surface of the semiconductor substrate 10 and apertures for at least the upper end portions of the external terminals 50 could be formed by ashing in a plasma or the like.

Figure 9:
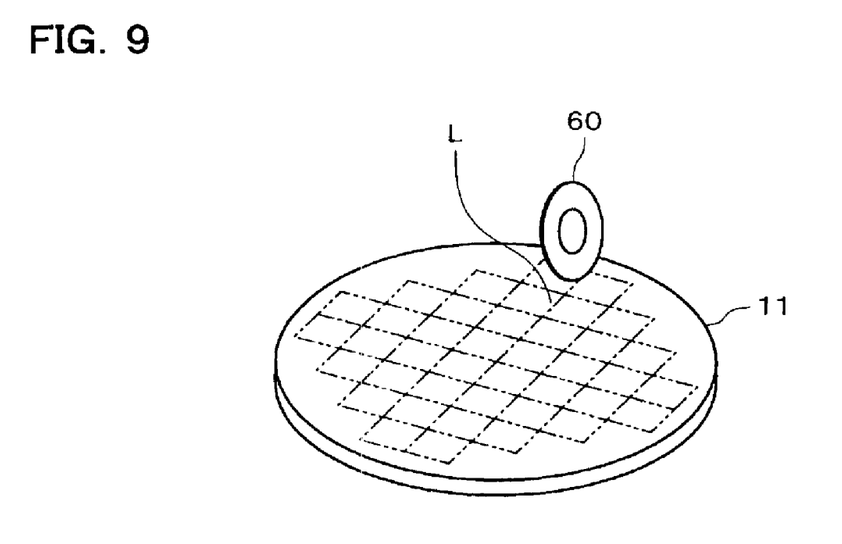
FIG. 9 is a diagram for illustrating a method of fabricating a semiconductor device in accordance with the first embodiment of the present invention.

If the above-described process is performed with chips in the semiconductor wafer state, a semiconductor substrate 11 is cut along lines L surrounding each integrated circuit, by a blade 60, as shown by way of example in FIG. 9. This produces a plurality of the semiconductor devices 1, cut from the semiconductor substrate 11. This enables packaging in wafer units. Since the thus-obtained semiconductor device 1 has a package size that is substantially equal to that of the semiconductor chip, it can be classified as CSP. Note that other details are similar to those of the above-described semiconductor device.

Figure 10:
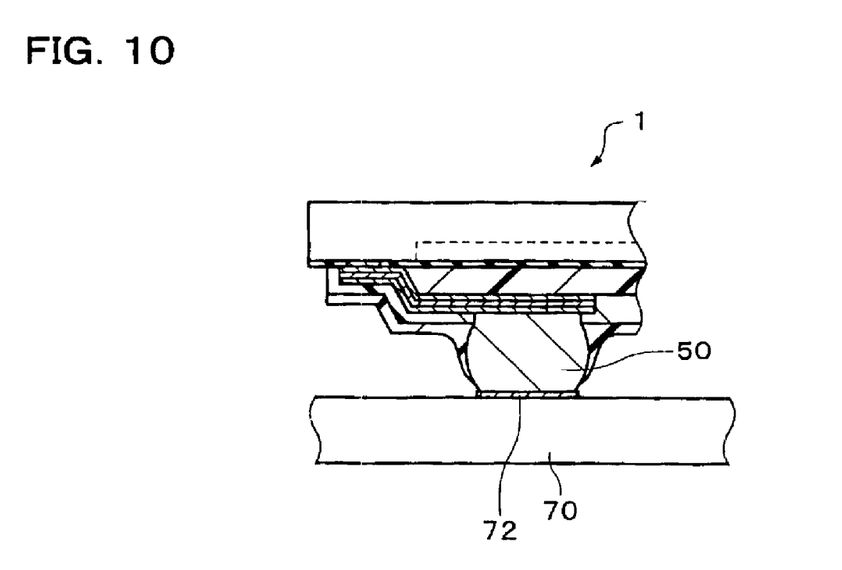
FIG. 10 is a diagram showing a circuit board in accordance with an embodiment of the present invention.

A circuit board on which a semiconductor device is mounted is shown in FIG. 10. A wiring pattern 72 is formed on a circuit board (motherboard) 70 and the external terminals 50 are connected to the wiring pattern 72. This makes is possible to efficiently relieve stresses generated by differences in the coefficient of thermal expansion between the circuit board 70 and the semiconductor substrate 10.

Second Embodiment

A method of fabricating a semiconductor device in accordance with a second embodiment of the present invention is shown in FIGS. 11 to 15. In this embodiment, the shapes of the resin layer and the land differ from those described above. The details described with reference to the first embodiment can be applied to those of this embodiment, as far as possible.

Figure 11:
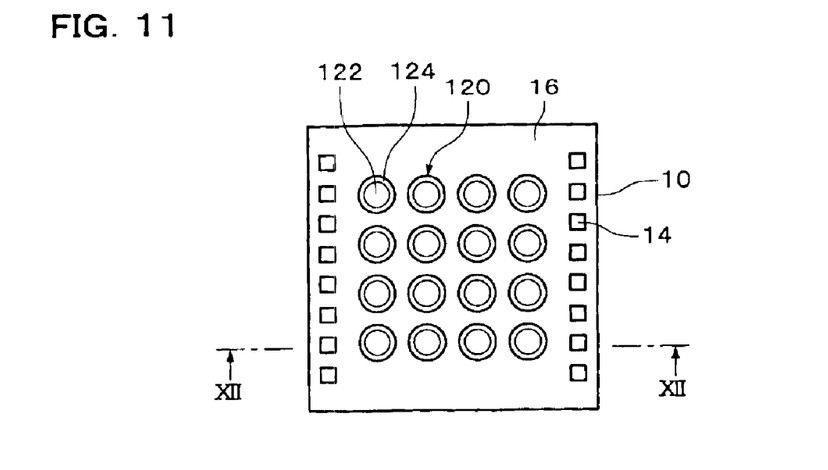
FIG. 11 is a diagram for illustrating a method of fabricating a semiconductor device in accordance with a second embodiment of the present invention.

The semiconductor substrate 10 is first prepared. The integrated circuit 12, the electrodes 14, and the protective film 16 are formed on the semiconductor substrate 10. The semiconductor substrate 10 could be a semiconductor wafer. Since this would enable batch processing of the fabrication of semiconductor devices in the wafer state, it increases mass-productivity. FIG. 11 shows the portion that will become one semiconductor chip, from the semiconductor wafer. Alternatively, the fabrication process described below could be performed after the semiconductor chip has been separated.

As shown in FIG. 11, a resin layer 120 is formed over the semiconductor substrate 10 (above the protective film 16, by way of example). More specifically, a plurality of the resin layers 120 are formed at positions that differ in the plane of the semiconductor substrate 10 (the regions of the semiconductor wafer that will become the semiconductor chips). For example, the plurality of resin layers 120 could be formed to correspond to the regions of the external terminals 50 that are formed at different positions in the plane. In other words, each of the external terminals 50 could be disposed above one of the resin layers 120. If each resin layer 120 is formed at the central position of the region that will become the semiconductor chip, it is possible to avoid the plurality of electrodes 14 formed at edge portions thereof. Note that other details of the resin layer 120 are similar to those of the resin layer described with reference to the first embodiment.

Figure 12:
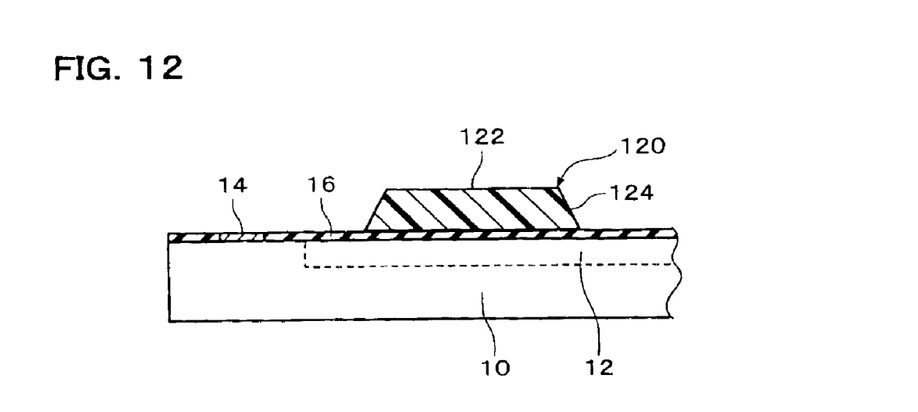
FIG. 12 is a sectional view of the semiconductor device taken along the line XII—XII of FIG. 11.

As shown in FIG. 12, each resin layer 120 has an upper surface 122 and a side surface 124. The upper surface 122 of the resin layer 120 is preferably a flat surface. It is also preferable that the side surface 124 of the resin layer 120 is provided with a taper. More specifically, the side surface 124 of the resin layer 120 could be provided with a taper such that the surface area of the upper surface 122 is less than surface area of the lower surface (base surface) thereof on the semiconductor substrate 10 side. This facilitates the formation of penetrating holes 134 in portions of the side surface 124 of the resin layer 120. The shape of the resin layer 120 in plan view could be circular. In the example shown in these figures, the resin layer 120 has a conical shape. The height of the resin layer 120 could be approximately 30 $\mu$m, by way of example.

The resin layer 120 can be formed by a photographic technique. In such a case, a photo-sensitive material such as a photopolymer can be used as the material of the resin layer 120. The resin layer 120 is provided over the entire surface of the semiconductor substrate 10, a mask is applied, and energy (in most cases, optical energy) is irradiated thereon. If the material of the resin layer 120 is of a positive type, the solubility of the portions that were irradiated is increased and those portions are removed by development. Conversely, if the material of the resin layer 120 is of a negative type, the solubility of the portions that were irradiated is decreased and those portions remain while other portions are removed by development. Since a photographic technique enables adjustment of factors such as the thickness and aperture size of the mask and the magnitude and angle of the energy irradiation, it makes it possible to apply the taper to the side surface 124 of the resin layer 120.

Figure 13:
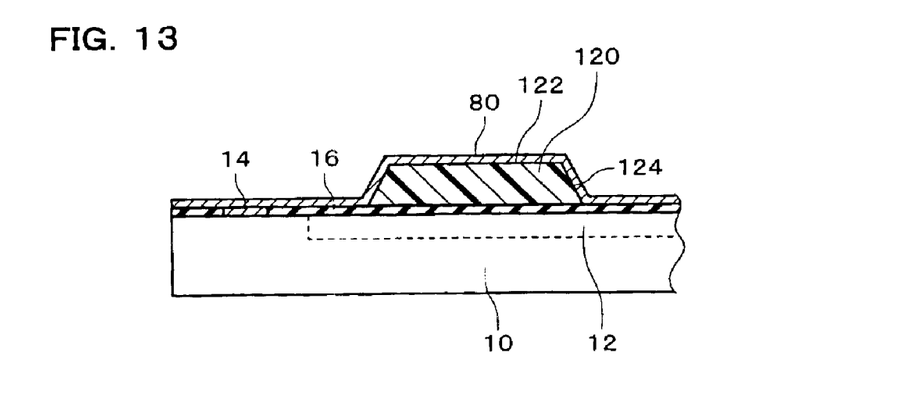
FIG. 13 is a diagram for illustrating the method of fabricating a semiconductor device in accordance with the second embodiment of the present invention.

A first layer 80 that is the material for a wiring layer 130 is then applied, as shown in FIG. 13. The first layer 80 is formed to cover at least the plurality of resin layers 120. In this case, the first layer 80 could be formed over the entire surface of the semiconductor substrate 10 (including each upper surface 122 and side surface 124). The first layer 80 could be formed by a method such as sputtering.

Figure 14:
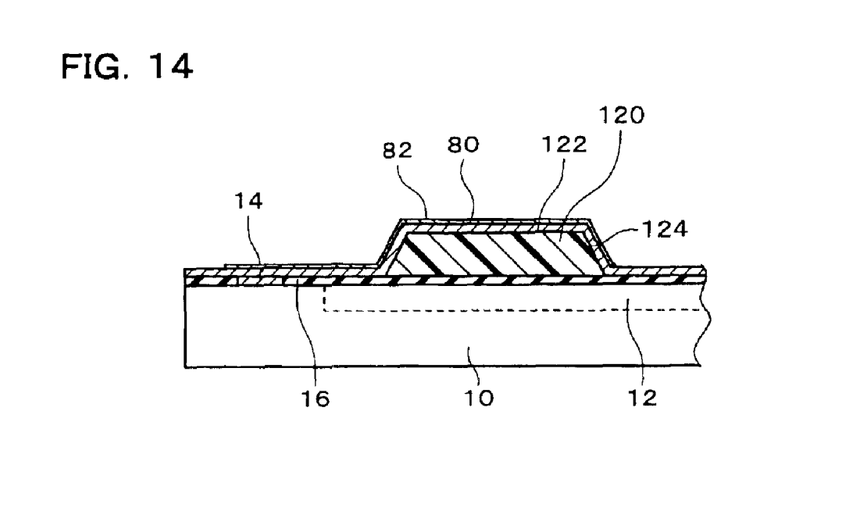
FIG. 14 is a diagram for illustrating the method of fabricating a semiconductor device in accordance with the second embodiment of the present invention.

A second layer 82 is patterned above the first layer 80, as shown in FIG. 14. The second layer 82 acts as a mask for the formation of the wiring layer 130. In the example shown in FIG. 14, the second layer 82 is formed to overlay portions of the first layer 80 that will remain as the wiring layer 130. The second layer 82 could be formed to have aperture portions. Each aperture portion of the second layer 82 forms a region in the wiring layer 130 for the formation of a penetrating hole 134 (see FIG. 15B). This makes it possible to form wiring layer 130 having the penetrating holes 134. The aperture portions of the second layer 82 could be formed in the side surface 124 of the resin layer 120. Note that the second layer 82 could be formed by patterning a resist (not shown in the figure) previously then forming the aperture portions in that resist. That resist is peeled off after the formation of the second layer 82

The second layer 82 could be formed of an electrically conductive material. In such a case, part of the second layer 82 could form part of the wiring layer 130. The second layer 82 could be a plated layer formed by electroplating or a non-electrolytic plating method. Since this leaves part of the second layer 82 as a plated layer, there is no need to form another plated layer above the wiring layer 130.

Figure 15A:
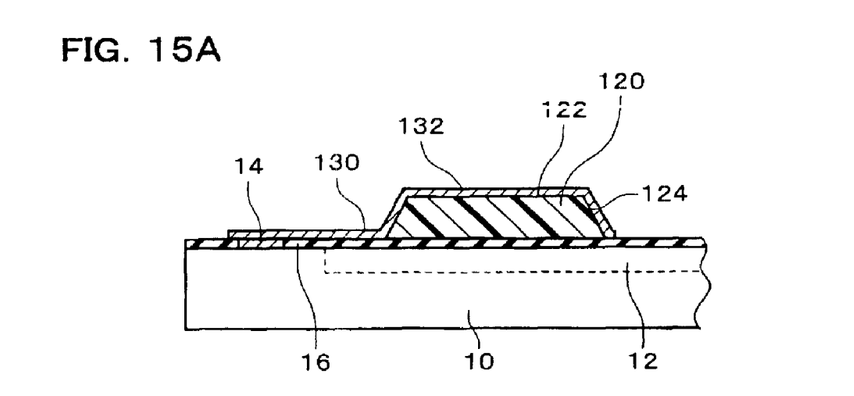
FIGS. 15A and 15B are diagrams for illustrating the method of fabricating a semiconductor device in accordance with the second embodiment of the present invention.
Figure 15B:
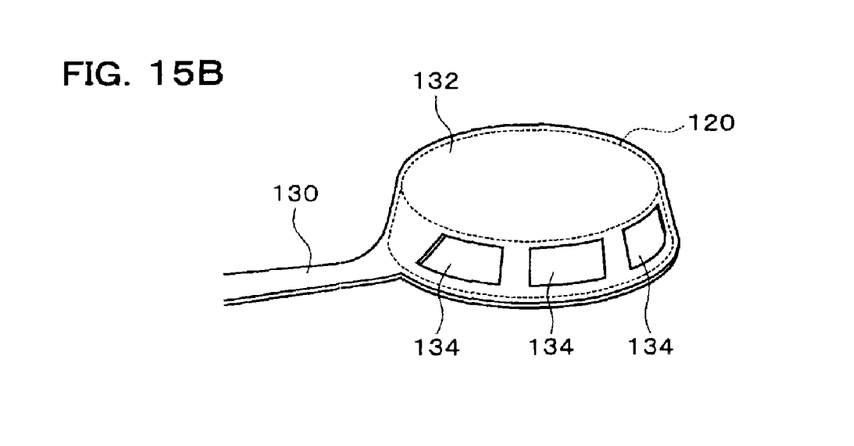

As shown in FIG. 15A, the first and second layers 80 and 82 etched (by wet etching, by way of example). This removes the portions of the first layer 80 that are exposed from the second layer 82, leaving the portions thereof that are covered by the second layer 82 unetched. At least part of the second layer 82 is removed. The wiring layer 130 is then formed. As can be seen from the perspective view of FIG. 15B, the wiring layer 130 has the penetrating holes 134. The penetrating holes 134 could be formed in the side surface 124 of the resin layer 120. The resin layer 120 is exposed within each penetrating hole 134. With this embodiment of the invention, the wiring layer 130 has the first layer 80. The wiring layer 130 could also have part of the second layer 82 as well.

Figure 16:
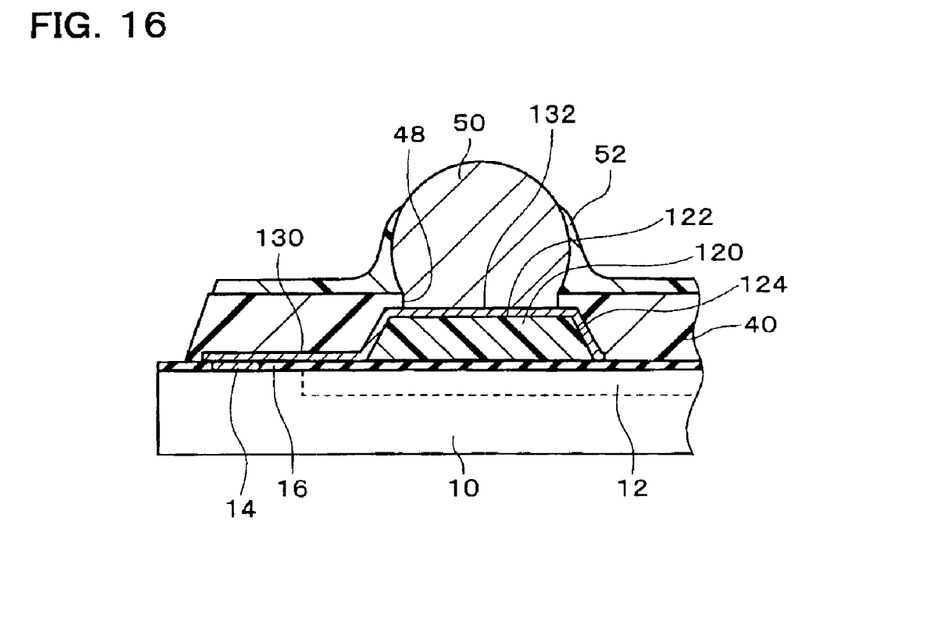
FIG. 16 is a diagram showing the semiconductor device in accordance with the second embodiment of the present invention.
Figure 17:
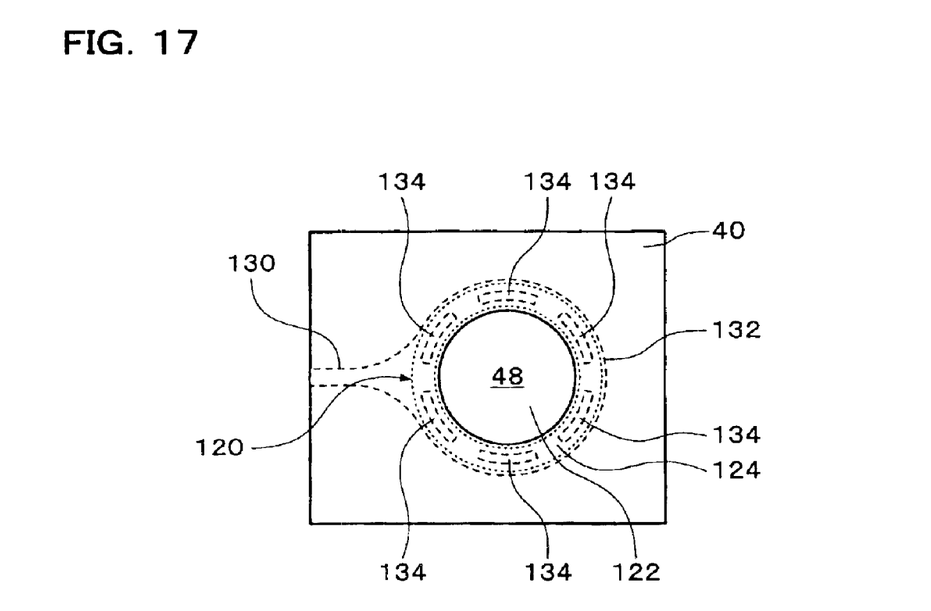
FIG. 17 is a diagram showing the semiconductor device in accordance with the second embodiment of the present invention.

A partial expanded view of a semiconductor device in accordance with this embodiment is shown in FIG. 16. A plan view of FIG. 16 is shown in FIG. 17, with parts of the semiconductor device (such as the wiring layer and external terminals) omitted. The semiconductor device in accordance with this embodiment includes the semiconductor substrate 10, the resin layer 120, and the wiring layer 130. In the example shown in FIG. 16, the semiconductor device further includes the resist layer 40, the external terminals 50, and the second resin layer 52.

The wiring layer 130 has a land 132. As shown in FIG. 17, the land 132 is formed integrally with the upper surface 122 and the side surface 124 of the resin layer 120. The penetrating holes 134 are formed in the land 132. The penetrating holes 134 could be formed in portions of the land 132 covering the side surface 124 of the resin layer 120. Providing the side surface 124 of the resin layer 120 with a taper makes it easy to form the penetrating holes 134. As a variant, the penetrating holes 134 could be formed in the upper surface of the resin layer 120 in the land 132, or they could be formed integrally in the upper surface and the side surface of the resin layer 120 of the land 132.

An aperture portion 48 of the resist layer 40 exposes the land 132. As shown in FIG. 17, the aperture portion 48 could also expose parts of the upper surface 122 of the resin layer 120 in the land 132. This would make it possible to form the external terminal 50 on a flat portion of the land 132.

This embodiment achieves the effects described with reference to the first embodiment. All other details of this embodiment are equivalent to those described for the first embodiment.

Figure 18:
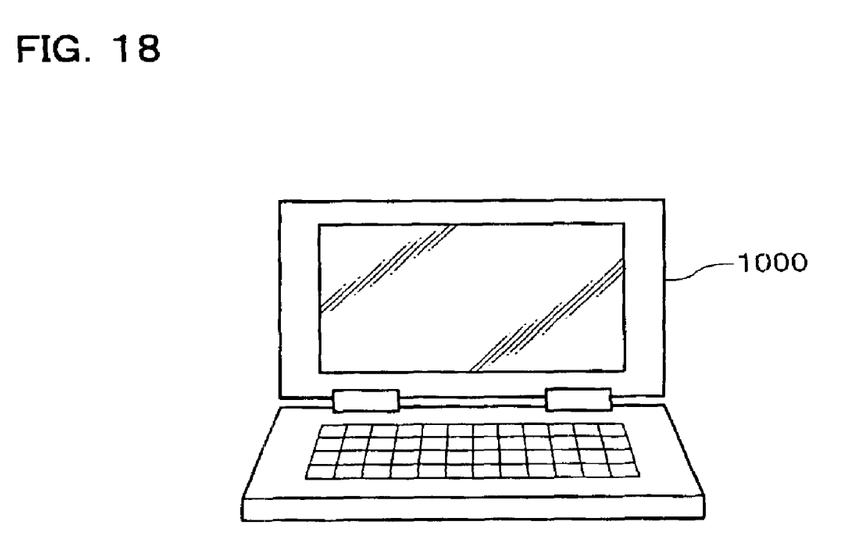
FIG. 18 is a diagram showing an electronic instrument in accordance with an embodiment of the present invention.
Figure 19:
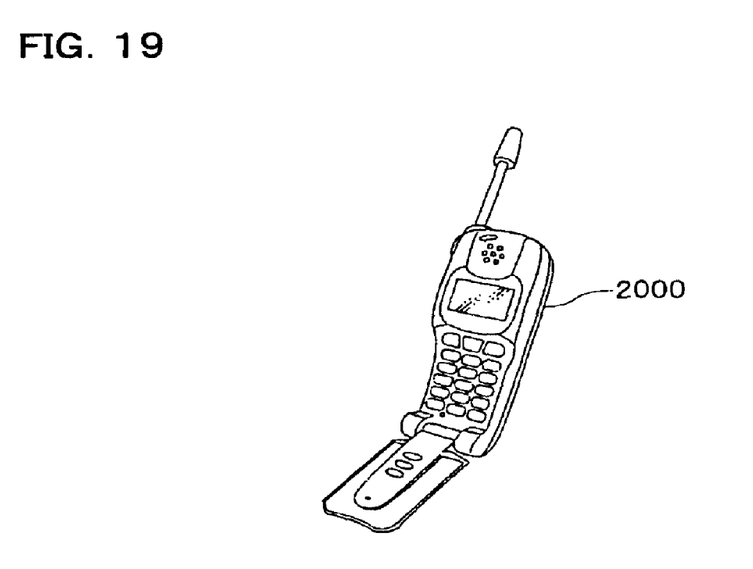
FIG. 19 is a diagram showing an electronic instrument in accordance with an embodiment of the present invention.

Examples of electronic instruments having the semiconductor device in accordance with embodiments of the present invention are a notebook-sized personal computer 1000 shown in FIG. 18 and a mobile phone 2000 shown in FIG. 19.

The present invention is not limited to the above-described embodiments, and various modifications can be made. For example, the present invention includes various other configurations substantially the same as the configurations described in the embodiments (in function, method and effect, or in objective and effect, for example). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. A semiconductor device comprising:
   a semiconductor substrate having an integrated circuit and an electrode that is connected electrically to the integrated circuit;
   a resin layer formed on a surface of the semiconductor substrate on which the electrode is formed, avoiding the electrode; and
   a wiring layer which is electrically connected to the electrode and has a land formed on the resin layer,
   a penetrating hole that exposes the resin layer being formed in the land.

2. The semiconductor device as defined in claim 1, the shape of the land in plan view being substantially circular.

3. The semiconductor device as defined in claim 1, the penetrating hole being an elongated hole.

4. The semiconductor device as defined in claim 1, the penetrating hole being an elongated hole extending along the outer edge portion of the land.

5. The semiconductor device as defined in claim 1, a plurality of the penetrating holes being formed in the land.

6. The semiconductor device as defined in claim 5, the penetrating holes being arranged along the outer edge portion of the land.

7. The semiconductor device as defined in claim 5, the penetrating holes being disposed with substantially equal distances between adjacent holes.

8. The semiconductor device as defined in claim 1, the land being formed on an upper surface of the resin layer.

9. The semiconductor device as defined in claim 1, a plurality of the resin layers being formed at different positions in plan view on the semiconductor substrate; and
   the land being formed integrally with an upper surface and a side surface of one of the resin layers.

10. The semiconductor device as defined in claim 9, the penetrating hole being formed in a portion of the land covering the side surface of the resin layer.

11. The semiconductor device as defined in claim 9, the side surface of the resin layer being tapered.

12. The semiconductor device as defined in claim 9, the resin layer substantially having a shape of conical frustum.

13. The semiconductor device as defined in claim 1, further comprising:
    a resist layer being formed on a surface of the semiconductor substrate on which the electrode is formed, and having an aperture that causes at least part of the land to be exposed.

14. The semiconductor device as defined in claim 13, the shape of the aperture of the resist layer in plan view being substantially circular.

15. The semiconductor device as defined in claim 13, the resist layer filling at least part of the penetrating hole.

16. The semiconductor device as defined in claim 13, the resist layer being formed to fill the penetrating hole; and
    part of an edge of the penetrating hole being substantially in contact with an edge of the aperture of the resist layer.

17. The semiconductor device as defined in claim 1, further comprising:
    an external terminal provided on the land.

18. The semiconductor device as defined in claim 17, further comprising:
    a second resin layer that avoids an upper portion of the external terminal but covers at least a lower portion of the external terminal.

19. The semiconductor device as defined in claim 1, the semiconductor substrate being a semiconductor chip.

20. The semiconductor device as defined in claim 1, the semiconductor substrate being a semiconductor wafer.

21. A circuit board on which is mounted the semiconductor device as defined in claim 1.

22. An electronic instrument comprising the semiconductor device as defined in claim 1.

23. A method of fabricating a semiconductor device, the method comprising:

forming a resin layer on a surface of a semiconductor substrate on which is formed an electrode that is connected electrically to an integrated circuit of the semiconductor substrate, avoiding the electrode; and forming a wiring layer which is electrically connected to the electrode and has a land formed on the resin layer.

a penetrating hole that exposes the resin layer being formed in the land.

24. The method of fabricating a semiconductor device as defined in claim 23, the penetrating hole being formed simultaneously with the wiring layer.

25. The method of fabricating a semiconductor device as defined in claim 23, a plurality of the penetrating holes being formed in the land.

26. The method of fabricating a semiconductor device as defined in claim 23, further comprising:

forming a resist layer on a surface of the semiconductor substrate on which the electrode is formed, the resist layer having an aperture that causes at least part of the land to be exposed.

27. The method of fabricating a semiconductor device as defined in claim 23, further comprising:

forming an external terminal on the land.

28. The method of fabricating a semiconductor device as defined in claim 23, comprising:

forming a plurality of the resin layers at different positions in plan view on the semiconductor substrate;

providing a material of the wiring layer to cover at least the resin layer;

patterning a plated layer as a mask on the material of the wiring layer; and forming the wiring layer and the penetrating hole by etching the material of the wiring layer and the plated layer in such a manner that portions of the material of the wiring layer covered by the plated layer remain.

* * * * *